United States Patent [19]

Zwingman

[11] 4,179,749
[45] Dec. 18, 1979

[54] DEFECT TOLERANT SCHEME FOR A BUBBLE LATTICE FILE

[75] Inventor: Robert L. Zwingman, Poway, Calif.
[73] Assignee: Burroughs Corporation, Detroit, Mich.
[21] Appl. No.: 918,477
[22] Filed: Jun. 23, 1978
[51] Int. Cl.² ............................................. G11C 19/08
[52] U.S. Cl. ............................................. 365/3; 365/35
[58] Field of Search ................................. 365/1, 3, 35
[56] References Cited
PUBLICATIONS IBM Technical Disclosure Bulletin-vol. 18, No. 8, Jan. 1976, pp. 2673-2674.
IBM Technical Disclosure Bulletin-vol. 17, No. 12, May 1975, pp. 3767-3772.

*Primary Examiner*—James W. Moffitt
*Attorney, Agent, or Firm*—Joseph R. Dwyer; Mervyn L. Young; Kevin R. Peterson

[57] ABSTRACT

A defect tolerant lattice file memory having means in the access column for annihilating lattice bubbles in a previously detected defective row thus eliminating an error in the digital information to be extracted from the lattice file. This annihilation means comprises a ladder formed in a conductor overlay located over the access column in which partial current loops may be formed by disconnecting certain selected portions of the ladder. These current loops create a localized magnetic field when the ladder conductor is activated thus annihilating the selected row of bubbles. Thus, lattice file chips found to have defective rows which will not support and maintain lattice bubbles in their desired coded state can now be utilized.

19 Claims, 6 Drawing Figures

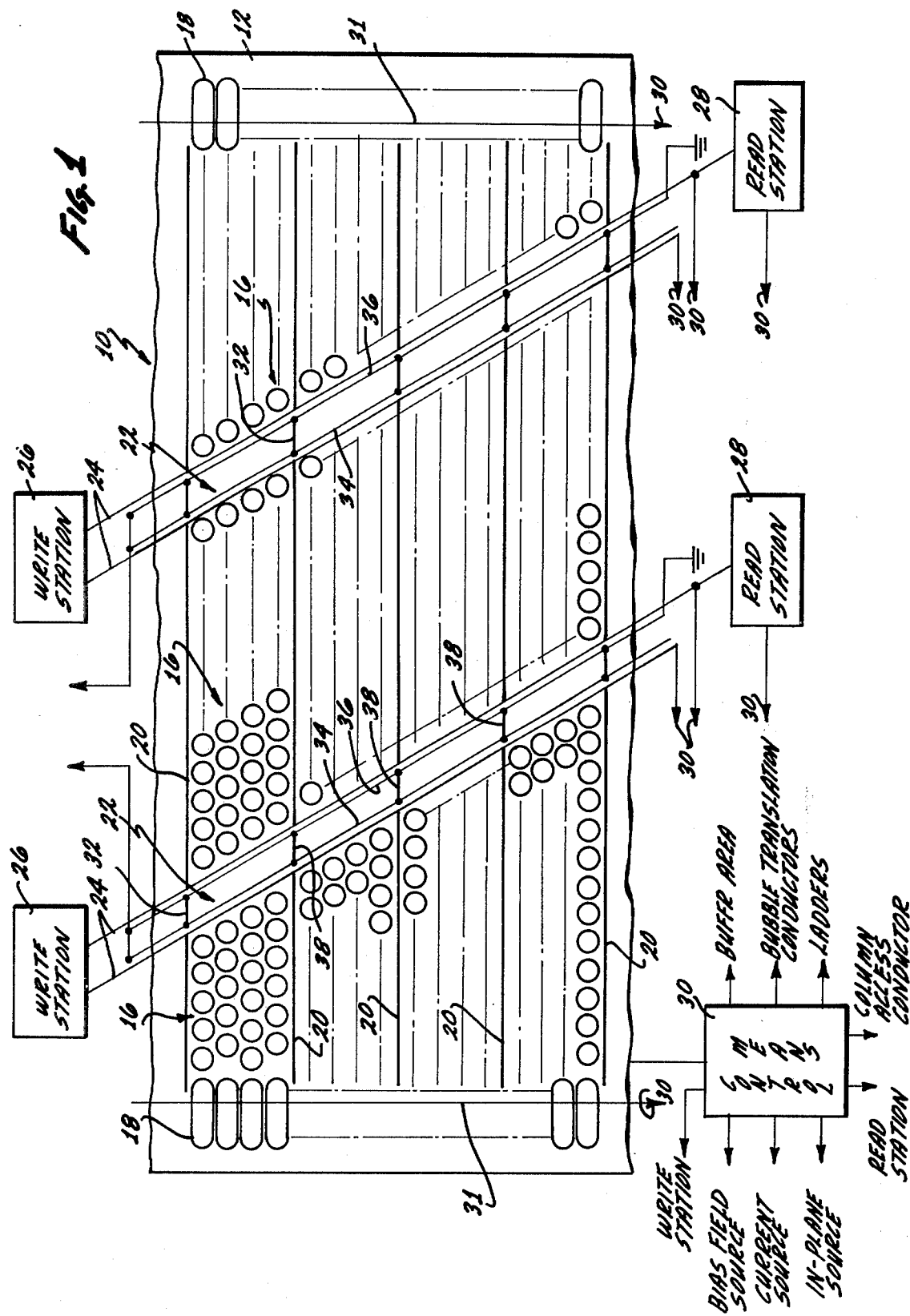

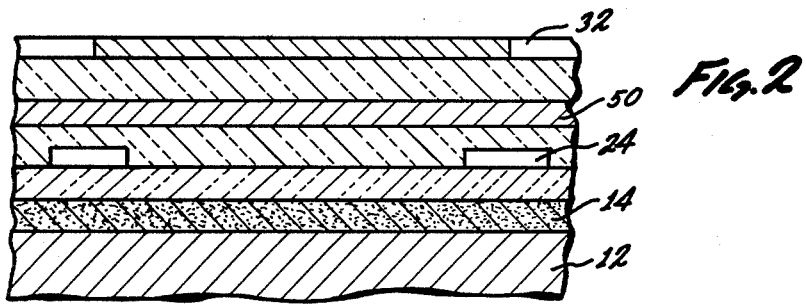
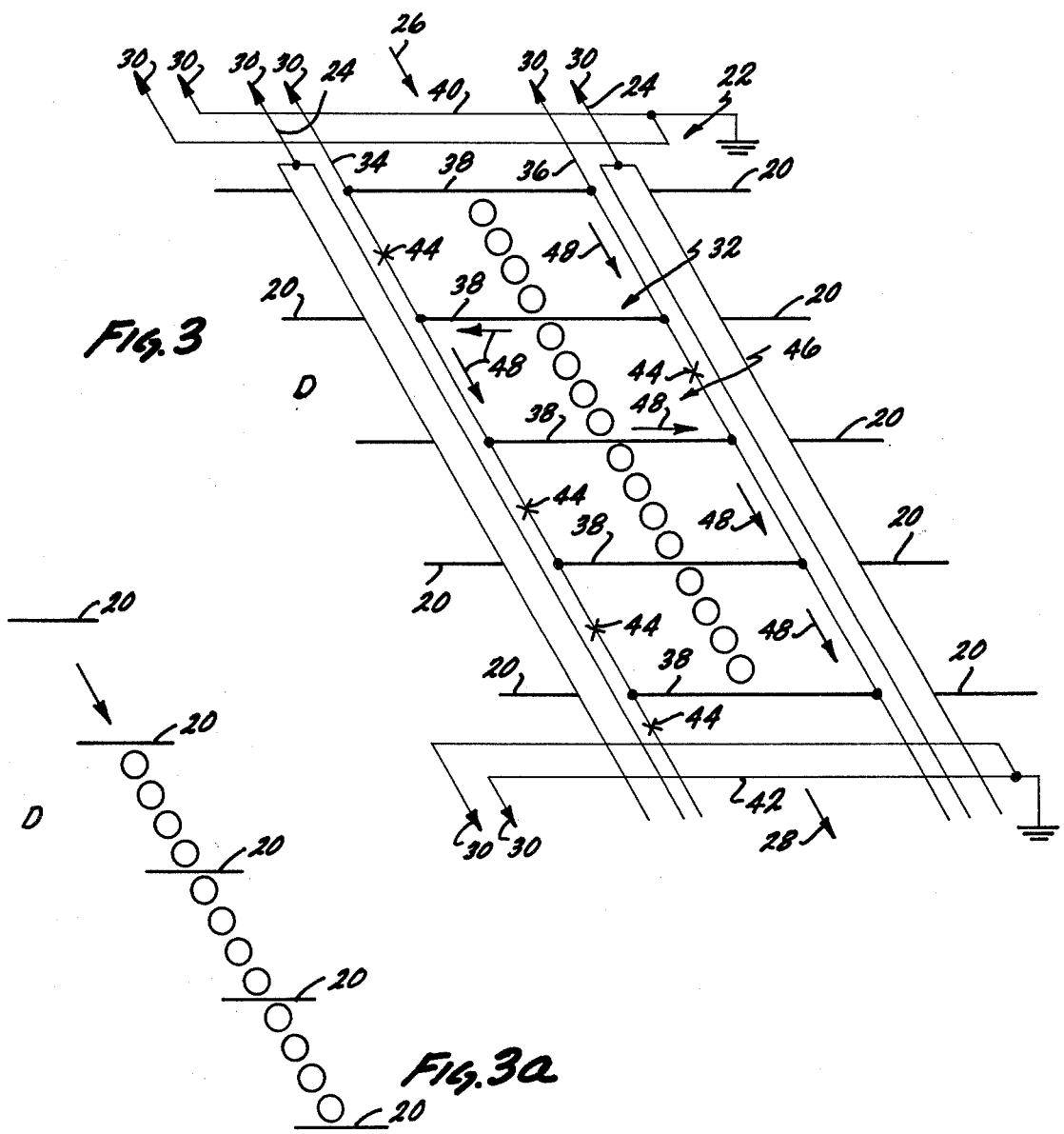

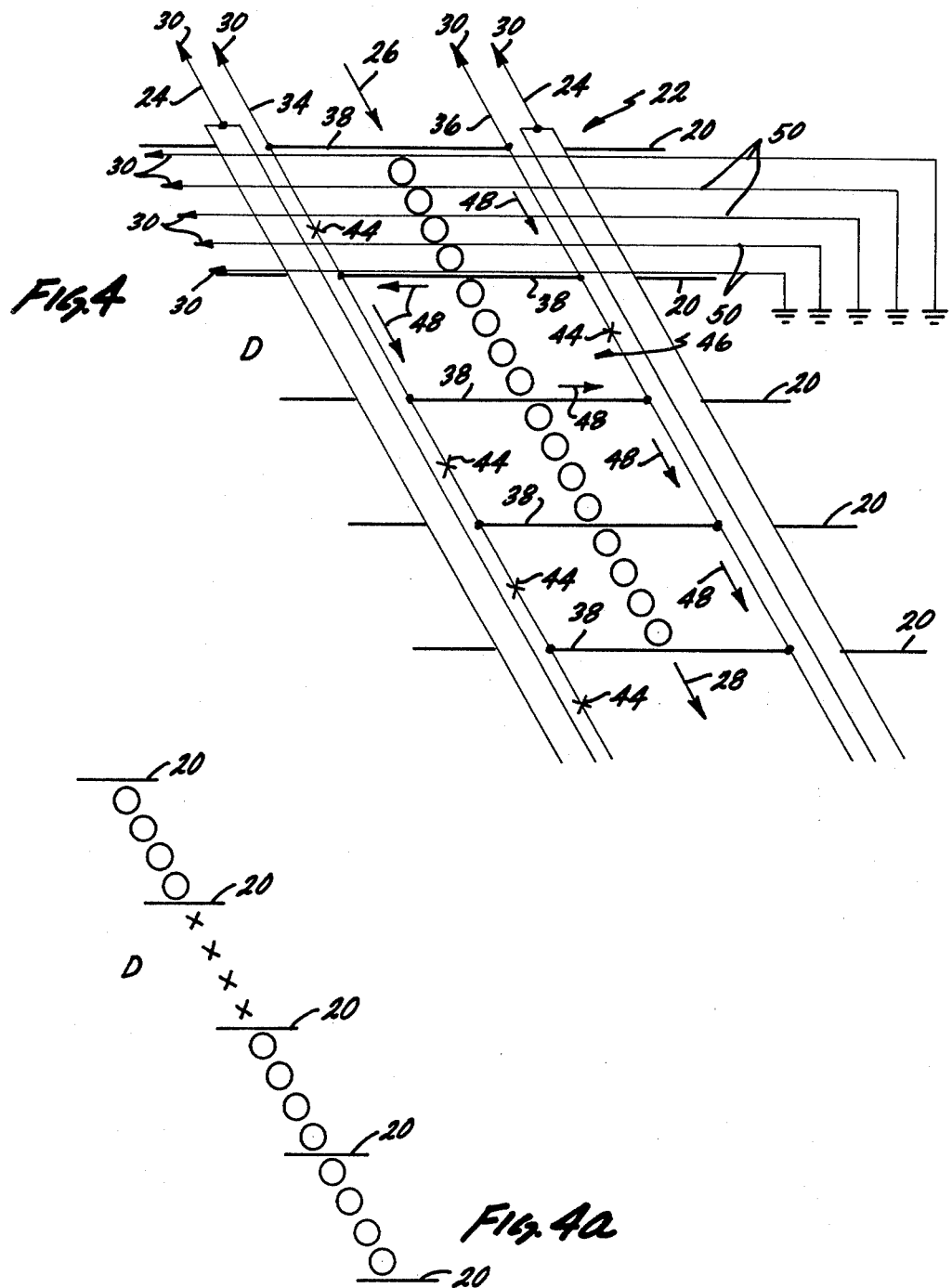

DEFECT TOLERANT SCHEME FOR A BUBBLE LATTICE FILE

BACKGROUND OF THE INVENTION

This invention relates to bubble (domain) lattice files and, in particular, to a scheme for making bubble lattice files defect tolerant.

Any number of prior art patents illustrate a lattice memory file utilizing stable two dimensional hexagonal closely packed array of interactive lattice bubbles created in a bubble film and teach that the lattice bubble diameter and lattice spacing are determined by the applied bias field, bubble-bubble interactions and the magnetic constants of the bubble film. See, for example, the U.S. Pat. Nos. to Mehta, et al. 4,034,357, to Lin, et al., 4,052,711, Hu, et al., 3,953,842 and others. The foregoing art also describes coding schemes utilizing different kinds of domain walls to provide digital information, viz, the U.S. Pat. No. to Hsu, 3,996,577 and also disclose means for confining the lattice bubbles and for limiting their travel to specific directions, viz, the U.S. Pat. Nos. to Eggenberger, 4,028,685, (rails), to Voegeli, 4,001,796 (rails and stripe domains) also Voegeli, 2,930,244 (rails and stripe domains) and to Rosier, 4,040,038 (stripe domains). Also, this prior art teaches means for accessing information contained in the lattice file, viz, the U.S. Pat. Nos. to Rosier 4,040,038 supra, also Rosier 3,913,079 and the Voegeli patents, supra. This, conventionally, is accomplished by moving the lattice bubbles transversely of the rows for a reading and writing function. This transverse movement is called column accessing and to do this, lattice bubbles are moved to an area called an access column defined by column oriented conductors, are separated from other lattice bubbles and are then moved serially in the columns to a read station where the information is sensed according to the selected coding scheme. Writing is accomplished in a similar manner, but opposite to the read operation, in that bubbles are generated at a write station and moved serially in the access column to the lattice file. Movement of the lattice bubbles in the access columns is accomplished in two ways. One way is to pulse a series of conductors located transverse of the access column conductors to create a magnetic field which reacts with the lattice bubbles and moves them serially. The second way is to use a so-called bubble pump, Rosier U.S. Pat. No. 4,040,038 supra, by which lattice bubbles are simply forced serially in and out of the access column by the introduction of additional bubbles generated at the write station which interact with the lattice bubbles in the access columns.

In the manufacture of the lattice files memories, a great number of chips are formed on a large wafer, each of which contains, among other things, a garnet bubble supporting film, conductor overlay patterns and configurations to define the means for confining the lattice bubbles in the rows, for providing the conductors for column accessing, and for movement of the bubbles in the rows. When such chips are formed on a wafer, usually by a photolithographic process, for a number of reasons, one or more of the chips may be found to be defective so that the lattice bubbles may not be able to be maintained in the desired state for the selected code scheme. This, of course, would introduce error into the information to be stored in the lattice file memory and would ordinarily be a reason for rejecting the entire chip or perhaps a number of chips on a wafer. The larger the rejection rate, of course, increases the larger the increase in the cost of the manufacture of the chips.

There are, of course, a number of defect tolerant schemes for the magnet bubble devices arranged in the well known storage loop configuration; the U.S. Pat. Nos. to Ohnigian, et. al. 4,073,012, to Bogar, et al. 3,792,450, being typical examples, but these schemes are inapplicable in lattice memories since lattice memories depend upon the interaction of the bubbles themselves to maintain integrity whereas the other devices interact with propagate elements and not with each other.

It is therefore an object of this invention to provide a defect tolerant lattice file memory so that lattice file memory chips which would otherwise be discarded can now be used.

SUMMARY AND AN ADDITIONAL OBJECT OF THE INVENTION

The defect tolerant lattice file memory of this invention which overcomes the deficiency of the prior art and meets the foregoing object comprises means for annihilating lattice bubbles in a previously detected defective row from the lattice bubble flow path in the access column thus eliminating any error in the digital information to be extracted from the lattice file. In the embodiment illustrated, this annihilation means comprises a ladder formed in a conductor overlay located in the access column in which selected partial current loops may be formed by disconnecting certain selected portions of the ladder. The current loops create a localized magnet field, when the ladder conductor is activated, thus annihilating the selected row of the bubbles. Thus, by the simple addition of a conductor ladder overlay in the column access area, those lattice file chips, found to have defective rows which will not support and maintain lattice bubbles in their desired coded state, can now be utilized.

This annihilation means can be used with a conventional conductor/pulse operation to serially propagate bubbles out of the access column or with a conventional bubble pump by which bubbles are forced out of the access column by the entry of additional bubbles into the access column from the read station.

Thus, it is additional object of this invention to provide a lattice bubble file with a conductor ladder located in each column access layer in which magnetic loops may be created so that lattice bubbles in rows previously found to be defective may be destroyed at the time of the read access operation.

BRIEF DESCRIPTION OF THE DRAWINGS

FIG. 1 is a schematic illustration of a bubble lattice file having column accessing capabilities and showing buffer regions and rails as bubble confining means together with control means therefor;

FIG. 2 is a partial cross-sectional view of the bubble lattice file of FIG. 1 illustrating the various layers used, FIG. 3 is an enlarged illustration of a column accessing means comprising a bubble pump and illustrating the means for making the lattice file defect tolerant, and FIG. 3a shows the readout of the information utilizing a bubble pump, FIG. 4 shows column accessing utilizing a conductor method of column accessing together with the means for making the lattice file defect tolerant and FIG. 4a illustrates the readout of information utilizing the bubble conductor translator as shown in FIG. 4.

BRIEF DESCRIPTION OF THE PREFERRED EMBODIMENT

Turning now to FIGS. 1 and 2, there is shown a portion of a lattice memory file 10 comprising a conventional substrate 12 with a garnet film 14 for supporting lattice bubbles, indicated in their entirety as 16. This lattice file memory has confining means 18 in the form of stripe domains located at each end of the portion of the memory shown. Sometimes these stripe domains, or the areas at which they are located, are called buffers or buffer zones. The confining means also comprise suitable rails 20 for confining the bubbles in rows of a preselected number; four rows of lattice bubbles being shown by way of example. These buffers are also utilized to move the lattice domains back and forth in the rows and may therefore be located at selected locations in the lattice file.

Located transverse the rows of lattice bubbles are column access means 22 formed of parallel conductors 24 which are connected to a write station 26 and a read station 28, all of which are connected to a suitable control means 30. This control means also is connected to suitable conductors 31 to cause the buffers to function to move the bubbles, create additional bubbles if desired, and to control the bias field and inplane field magnetics, all of which is well known in the art.

In such a file, lattice bubbles are nucleated by a generator in the write station to have a wall magnetization structure for coding information and, in the read station, means are provided for deflecting their bubbles in accordance with their wall magnetization structure so that the information coded therein may be detected.

To accommodate the write and read operation, typically rows of lattice bubbles are moved to the column access means 22 whereupon the column access conductors 24 are activated; being connected to a suitable current source (depicted as connected to the control means 30). This tends to enlarge the lattice bubbles in the column and separate them from the lattice bubbles remaining in the lattice whereupon the bubbles in the columns may be translated toward the read station by any suitable means, such as the pulsing of the plurality of conductors with a suitable current or by means of a bubble pump. Both of these translating means are shown connected to the control means 30 and are shown in more detail in FIGS. 3 and 4.

Thus far described is a conventional lattice file memory, but also shown in FIGS. 1 and 2 and in more detail in FIGS. 3 and 4, is a means by which the bubble memory chip can be made defect tolerant.

To accomplish this result, ie., making the lattice file memory chips defect tolerant, the lattice file memory is provided with a defect tolerant means comprising additional conductors forming a ladder and indicated in its entirety as 32. FIG. 3 shows the invention 32 associated with a bubble pump and FIG. 4 shows the invention 32 associated with a conductor method of translating bubbles out of the memory. The difference between FIGS. 3 and 4 is only in the method by which the information will be read out as indicated respectively in FIGS. 3a and 4a.

Turning first to FIG. 3, the defect tolerant means 32 is shown as comprising pairs of conductors 34 and 36 substantially paralleling the column access conductors 24 and provided with rungs 38 spaced apart substantially the same distance as the distance between the rails 20 to coincide with the translation of the preselected number of lattice bubbles forming the rows into the access column means.

It is to be understood, of course, that the defect tolerant means 32 may remain inoperative in those chips found to be acceptable ie., those chips which upon inspection are found to be such that the lattice bubbles could be supported and maintained in the rows according to the coded scheme so that error would not be introduced into the data stored in the memory. However, in the event upon inspection, it was found that one or more areas of the lattice file were found to be defective in that lattice bubbles could not be maintained in their coded scheme, then the defect tolerant means can be utilized as will be explained hereinafter.

Taking first, however, the situation in FIG. 3 where a chip is found to be acceptable. Lattice bubbles are moved in a conventional manner into the column access means 22 and separated from the other lattice bubbles in the lattice by the activation of the column conductors 24, then lattice bubbles are generated by the bubble nucleator in the write station 26 and translated by suitable column pushers, such as conductors 40, located at the top of the column access means. These column pushers, of course, cooperate with column pullers in the form of conductors 42 located at the bottom of the access column, both being, of course, connected to a current source at control means 30. Being a bubble pump, the bubbles generated in the write station and moved by the column pushers 40 and column pullers 42 literally push the bubbles in the column access means 22 toward the read station 28 where the information contained in the lattice bubbles are sensed according to the coded scheme. Of course, the bubbles during this write operation can become a part of the information stored in memory and are entered by disconnecting the conductors 24 from the current source. It is to be noted that in this situation the defect tolerant means is simply nonfunctional.

On the other hand, if for example, one of the rows of the lattice files is found to be defective, although the lattice bubbles are necessary to maintain the integrity of the lattice file, the information contained in the row, being subject to possible error, can be eliminated so that such a possible error will not be introduced into the data being read out at the write station 28. To make the defect tolerant means 32 functional, at the row determined to be defective, as for example, row D in FIG. 3, one of the parallel conductors 34 and 36 and rungs 38 are cut as at 44 in a number of places by any suitable means to provide the proper current path, such as by a laser. Then, when the defect tolerant means 32 is activated momentarily by being connected to a suitable current source at the control means 30, current will be forced to flow through the selected rungs to form a loop indicated in its entirety as 46. This loop forms a localized magnetic field which will annihilate the row of lattice bubbles located in the defective row D within the column access means. The flow of current through conductor 36 and around the loop 46 is shown by the arrows.

When the bubbles are pumped by the pump, as described above, the row of bubbles immediately above the annihilated row D will be moved down by the incoming bubbles until they interact with the bubbles in the nonannihilated row below the annihilated row and ultimately will be pumped out to the write station in the manner described. Of course, the new lattice bubbles introduced into this column access means 22 by the bubble pump will be transferred into the defective row in the manner described above to maintain the integrity of the lattice file, but again, the information contained in the defective row will again be annihilated at the time that the lattice memory is again accessed. It is to be noted in this embodiment, that the number of lattice bubbles read out will be less than in the former situation where there are no defects in any of the rows. This is because of the annihilation of the row D bubbles and the compression of the data to be read by the bubble pump; however, the digital information will be recognized by a suitable software, it being recognized in advance that one row is defective and omitted in the informational readout. Note, for example, in the illustrated embodiment, four rows of four bubbles each, means sixteen lattice bubbles in the column access means before annihilation of the row D bubbles, but only twelve bubbles remain in the readout at FIG. 3a.

In the embodiment of FIG. 4, lattice bubbles are transferred to the column access means 22 in the same manner as described above in connection with the embodiment of FIG. 3, but, in this case, to translate the bubbles to read station 28, a series of conductors 50 are consecutively pulsed so as to translate the bubbles individually toward the read station. It is understood that, while only four of the conductors 50 are shown in the row above row D, there are four conductors for each row, one for each bubble in each row but all were omitted, except for the four shown for clarity. Again, in the event there is no defect in any of the rows of the lattice file, the ladder 32 of this invention may be inoperative or non-functional. However, in the event one of the rows is found to be defective, and in this embodiment for the purposes of this illustration, it will be the same row D as in the previously described embodiment, again, one of the parallel conductors 36 and 34 is selectively cut by any suitable means as at 44 to form the loop 46 for annihilating the bubbles in the defective row D. Again, in this instance, before the translation begins, conductor 36 is momentarily pulsed creating a magnetic field in row D and annihilating the bubbles. Then, the consecutive pulses are applied to the transverse conductors 50 for moving the remaining bubbles toward the read station 28. However, since each bubble is propagated out by individual conductors, spacing between the lattice bubbles is not eliminated, as in the case of the bubble pump, so that the readout will show where the annihilated bubbles were. This is shown in FIG. 4a and identified by the XXXX. It will again, of course, be a function of the readout means and the software to identify this defective row. However, again concurrently with, or after the lattice bubbles are translated out of the access means, additional lattice bubbles can be generated at the write station 26 and transferred into the column access means whereupon at the appropriate time the conductors 24 are deactivated and the new lattice bubbles are stored in memory.

From the foregoing it can be seen that there is disclosed a manner of making bubble chips defect tolerant and while it has been described in connection with one row and one column access means, obviously, the principle can be applied to other selcted rows found to be defective in the bubble chip. Also, it must be realized that the bubble chip can be made defect tolerant by the simple application of another conductor layer mask whose photolithographic requirements are at a minimum so that the cost of the extra mask is very little in comparison to the loss of an entire chip because of the possibility of only one or more defective rows found upon inspection after fabrication.

What is claimed is:

1. A defect tolerant lattice bubble memory having structure for supporting arrays of lattice bubbles which interact with each other comprising,
   confinement means for confining lattice bubbles and including means for moving said bubbles in a first direction in said confinement means,
   access means for accessing said lattice bubbles within said confinement means,
   said access means including second confinement means for supporting and confining selected lattice bubbles apart from other lattice bubbles and wherein said lattice bubbles can move in a second direction and means for moving said lattice bubbles in said second direction, and
   annihilating means located within said second confinement means for annihilating a predetermined number of lattice bubbles while in said second confinement means.

2. The lattice memory as claimed in claim 1 wherein said annihilating means comprises means for applying a localized electromagnetic field surrounding the lattice bubbles to be annihilated.

3. The lattice memory as claimed in claim 2 wherein said annihilating means comprises current carrying conductor means formed to define loop means which generate said localized magnetic field.

4. The lattice memory as claimed in claim 3 wherein said current carrying conductors are formed in a ladder configuration with selected segments thereof connected to form said loop means.

5. The lattice memory as claimed in claim 4 wherein said second confinement means comprises at least one pair of parallel current carrying conductors disposed in said second direction which when provided with current from a suitable current source will form a bias field which separates the selected lattice bubbles from said other lattice bubbles.

6. The lattice memory as claimed in claim 5 further including generation means for producing lattice bubbles and means for translating said bubbles to said access means.

7. The lattice memory as claimed in claim 6 wherein said access means further includes a plurality of means for applying electromagnetic fields to each of said selected bubbles in said second confinement means for moving said bubbles out of said access means.

8. The lattice memory as claimed in claim 7 including means for detecting said lattice bubbles moved out of said access means.

9. The lattice memory as claimed in claim 6 wherein said bubbles translated to said access means interact with the selected bubble in the access means and form the means for moving said bubbles out of said access means.

10. The lattice memory as claimed in claim 9 including means for detecting said lattice bubbles moved out of said access means.

11. A defect tolerant lattice bubble memory comprising,
    a lattice of interactive bubbles having wall domain structures representing bits of binary information stored in memory and defined in rows where said bubbles interact with one another and where one or more of said rows may be defective in that some of said interactive bubbles may not remain in their desired domain wall structure and thus may introduce error into the stored information, translation means for translating said bubbles in a first direction within said rows, accessing means spanning said rows for receiving selected bubbles from each row and for moving said selected bubbles in a second direction toward a read station where the bits of information are identified, and means in said accessing means for annihilating the bubbles of one or more of said defective rows before said bubbles are moved by said accessing means to eliminate possible error in the information identified at said read station.

12. The lattice bubble memory as claimed in claim 11 wherein said means for annihilating said selected bubbles comprises means for forming a localized electromagnetic field surrounding the bubbles from one or more of said defective rows.

13. A lattice bubble memory as claimed in claim 12 wherein said accessing means comprises conductor means located transverse to the rows of said bubbles and connected to a suitable current source for generating an electromagnetic bias field across said rows for separating said selected bubbles from the remainder of the bubbles in said rows.

14. The lattice bubble memory as claimed in claim 13 wherein said means for annihilating the bubbles of one or more of the defective rows comprises conductor means for forming loop means around the bubbles of said one or more defective rows for applying said electromagnetic field when connected to a suitable current source.

15. The lattice bubble memory as claimed in claim 13 wherein said means for annihilating the bubbles of one or more of said rows comprises pairs of conductor means paralleling the conductor means of said accessing means and connected with conductor means located in correspondence with said rows with certain of the parallel conductor means disconnected to form loop means around the one or more of said defective rows.

16. The lattice memory as claimed in claim 13 further including a generation means for producing lattice bubbles and means for translating said bubbles to said access means.

17. The lattice memory as claimed in claim 16 wherein said access means further includes a plurality of means for applying electromagnetic fields to each of said selected domains in said access means for moving said bubbles out of said access means.

18. The lattice memory as claimed in claim 16 wherein said bubbles translated to said access means interact with the selected bubbles in said access means and thus form the means for moving said bubbles out of said access means.

19. A method for accessing lattice bubble memories which have defective areas which may not support the lattice bubbles in the desired wall domain structure, comprising the steps of:

establishing a plurality of rows of said lattice bubbles,
moving said lattice bubbles in a first direction and selectively separating and confining certain of said lattice bubbles in said plurality of rows for movement in a direction transverse to the first direction,
annihilating selected ones of said separated lattice bubbles while confined which were from areas determined to be defective and moving the remaining separated lattice bubbles from the lattice in a direction substantially transverse to said first direction.

* * * * *